(12) United States Patent
Kumar

(10) Patent No.: US 9,748,957 B2
(45) Date of Patent: Aug. 29, 2017

(54) VOLTAGE LEVEL SHIFTER CIRCUIT, SYSTEM, AND METHOD FOR WIDE SUPPLY VOLTAGE APPLICATIONS

(71) Applicant: STMICROELECTRONICS INTERNATIONAL N.V., Amsterdam (NL)

(72) Inventor: Vinod Kumar, Pratapgarh (IN)

(73) Assignee: STMICROELECTRONICS INTERNATIONAL N.V., Amsterdam (NL)

( * ) Notice: Subject to any disclaimer, the term of this patent is extended or adjusted under 35 U.S.C. 154(b) by 63 days.

(21) Appl. No.: 14/231,447

(22) Filed: Mar. 31, 2014

(65) Prior Publication Data
US 2015/0280714 A1 Oct. 1, 2015

(51) Int. Cl.
*H03L 5/00* (2006.01)
*H03K 19/0185* (2006.01)
*H03K 3/356* (2006.01)

(52) U.S. Cl.
CPC ..... *H03K 19/0185* (2013.01); *H03K 3/35613* (2013.01); *H03K 3/356165* (2013.01)

(58) Field of Classification Search
CPC ......... H03K 3/356113; H03K 3/35613; H03K 3/45475; H03K 19/018521
See application file for complete search history.

(56) References Cited

U.S. PATENT DOCUMENTS

| | | | |
|---|---|---|---|
| 6,373,459 B1* | 4/2002 | Jeong | G09G 3/3688 345/100 |
| 6,377,086 B1* | 4/2002 | Bays | H03K 19/018521 307/412 |
| 6,487,687 B1 | 11/2002 | Blake et al. | |
| 6,693,469 B2 | 2/2004 | Prodanov | |
| 7,215,146 B2 | 5/2007 | Khan | |
| 7,397,273 B1* | 7/2008 | Ng | H03K 19/173 326/38 |
| 2001/0050398 A1* | 12/2001 | Takahashi | H01L 27/092 257/368 |
| 2011/0018606 A1* | 1/2011 | Cassia | H03K 3/35613 327/333 |

OTHER PUBLICATIONS

Monga et al. (2011) "A 73[MU]W 400MBPS Stress Tolerant 1.8V-3.6V Driver in 40NM CMOS;" Proceedings of the Esscirc; Helsinki; pp. 187-190.

* cited by examiner

*Primary Examiner* — Sibin Chen
(74) *Attorney, Agent, or Firm* — Seed IP Law Group LLP

(57) ABSTRACT

A level shifter circuit is configured to receive first and second complementary input signals. Each of the first and second complementary input signals have a value of either a first supply voltage or a first reference voltage. The level shifter further includes a strong latch circuit operable in response to the first and second complementary input signals to drive one of first and second output signals to a second supply voltage and includes a weak latch circuit operable to drive the other of the first and second output signals to a second reference voltage.

18 Claims, 9 Drawing Sheets

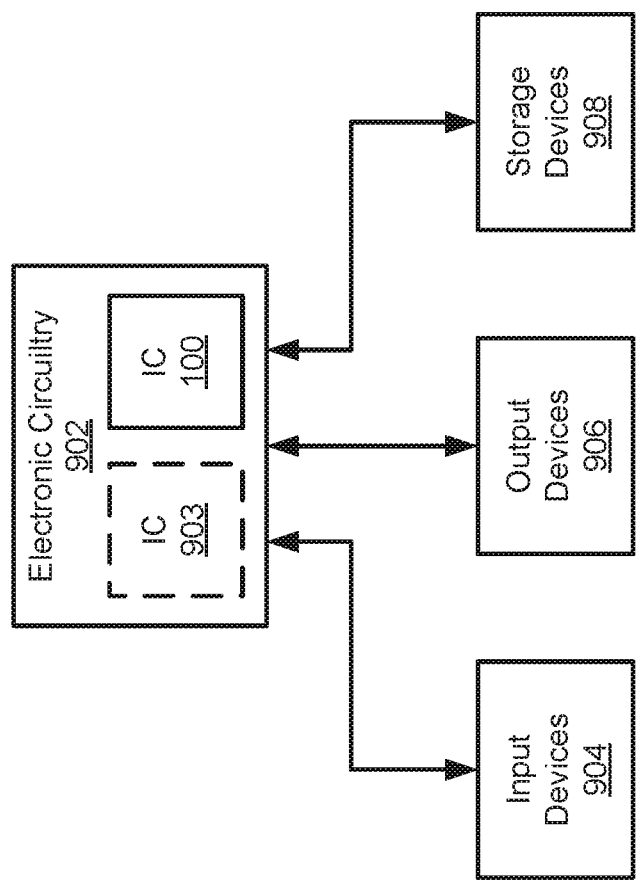

VOLTAGE LEVEL SHIFTER CIRCUIT, SYSTEM, AND METHOD FOR WIDE SUPPLY VOLTAGE APPLICATIONS

TECHNICAL FIELD

The present disclosure relates generally to integrated circuits and relates more specifically to voltage level shifting circuits and methods in integrated circuits and in systems containing integrated circuits.

BACKGROUND

Level shifters are circuits that are used in electronic systems including multiple voltage domains. In such multiple voltage domain systems, different blocks of circuitry operate at different voltage levels and level shifters function to convert signals in one voltage domain to signals in another voltage domain. Different blocks of circuitry can be different functional circuits on the same chip or integrated circuit, such as memory blocks and analog blocks, for example, or in system-on-a-chip applications. Different blocks can also correspond to different integrated circuits that are electrically interconnected to form a desired system. At least some of these different blocks have different voltage domains (i.e., utilize different supply voltages) and thus level shifters are utilized to "shift" signal levels in communicating signals from one block to another. For example, some blocks of circuitry may utilize a 1.8V supply voltage, other blocks a 2.5V supply voltage, and still other blocks a 3.3V supply voltage. Level shifters may be needed when a signal passes from one voltage domain to another.

In state of the art integrated circuits utilizing Metal-Oxide-Semiconductor (MOS) devices having a feature size or dimensions below 40 nm, for example, maximum voltage stress tolerances of oxides in the devices also necessitate the use of level shifters to ensure such tolerances are not exceeded, which may damage the devices. In such advanced MOS technologies (i.e., with devices having dimensions below 40 nm) a maximum voltage stress tolerance may be 2.0 volts, for example. In this situation, a wide supply voltage range circuit, such as a level shifter circuit contained in an input/output (I/O) buffer, which can receive a wide supply voltage range (e.g., 1.8V, 2.5V, 3.3V) can result in damage to the MOS devices forming the buffer since the maximum voltage stress tolerance on a MOS device may be exceeded. Thus, the required level shifting function of such a buffer that communicates signals between voltage domains must not result in damage to the MOS device forming the buffer due to the maximum voltage stress tolerance being exceeded. A conventional approach to provide these level-shifting I/O buffers is to provide circuitry that is configured in response to voltage level control signals having values determined by the provided supply voltage levels such that the circuitry is configured so none of the MOS devices forming the buffer are damaged due to the maximum voltage stress tolerance being exceeded. In certain architectures of such level-shifting I/O buffers it is difficult to provide the required voltage level control signals to each of the buffers to configure them as required as a function of the supply voltage being provided. Accordingly, improved methods and circuits for level shifters and level-shifting buffers containing such level shifters are needed.

SUMMARY

According to one embodiment of the present disclosure, a level shifter circuit is configured to receive first and second complementary input signals. Each of the first and second complementary input signals have a value of either a first supply voltage or a first reference voltage. The level shifter further includes a strong latch circuit operable in response to the first and second complementary input signals to drive one of first and second output signals to a second supply voltage and includes a weak latch circuit operable to drive the other of the first and second output signals to a second reference voltage.

According to another embodiment, a method includes shifting voltage levels of first and second complementary input signals. Each of the first and second complementary input signals has either a first voltage level or a second voltage level. The shifting voltage levels includes providing a first current to a first output node to drive a first output signal on the first output node to a third voltage level responsive to the first complementary input signal. The method further includes providing a second current to a second output node to drive a second output signal on the second output node to a fourth voltage level responsive to the first output signal. The second current has a magnitude that is less than a magnitude of the first current.

BRIEF DESCRIPTION OF THE DRAWINGS

FIG. 9 is a functional block diagram of an electronic system including one or both the levels shifters of FIGS. 3 and 4 according to another embodiment of the present disclosure.

DETAILED DESCRIPTION

Figure 1:
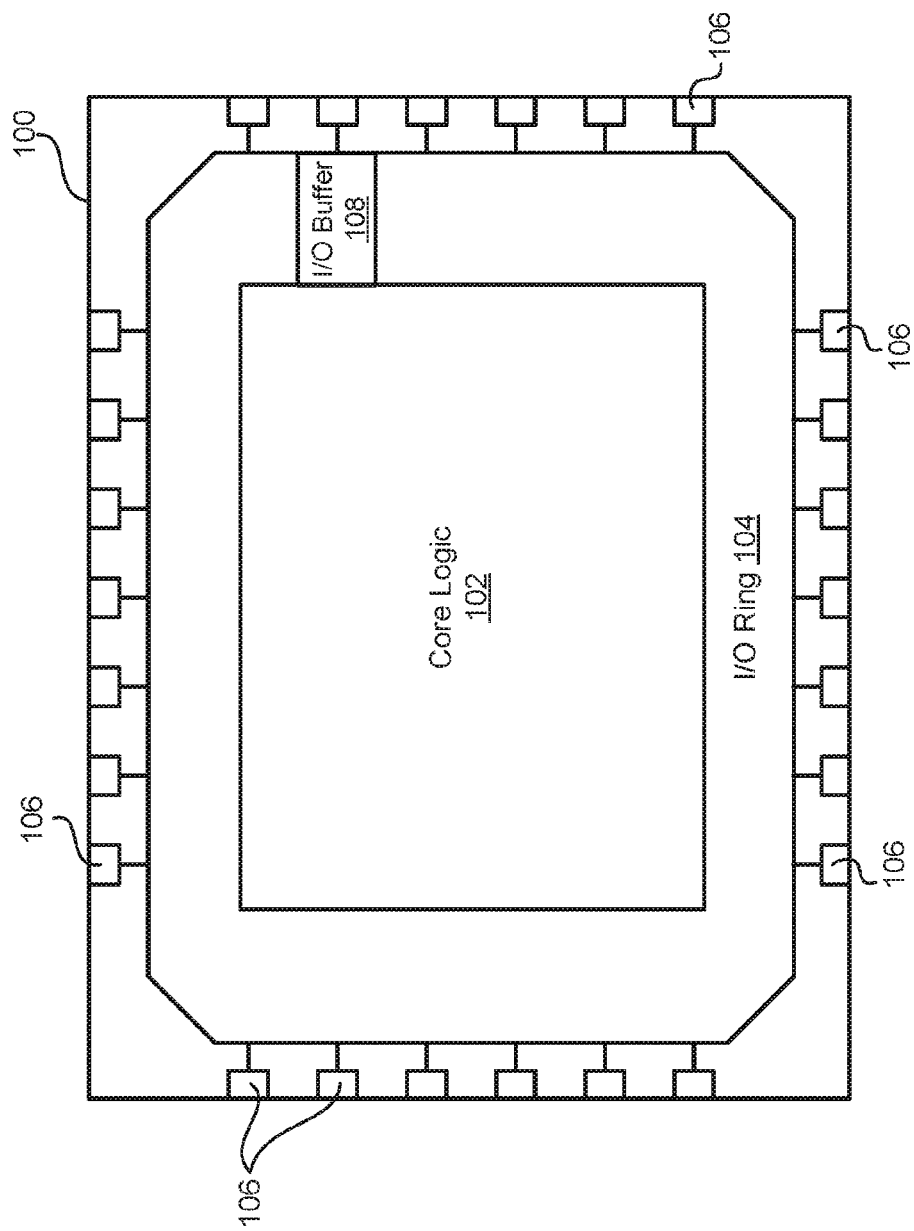
FIG. 1 is a simplified top view of an integrated circuit illustrating the physical layout of functional portions of the integrated circuit and showing where embodiments of the present disclosure would typically be utilized in such an integrated circuit.

FIG. 1 is a simplified top view of an integrated circuit 100 illustrating the physical layout of functional portions of the integrated circuit and showing where level shifters (not shown) according to embodiments of the present disclosure would typically be utilized in the integrated circuit. In the present description, certain details are set forth in conjunction with the described embodiments to provide a sufficient understanding of the subject matter of the present disclosure. One skilled in the art will appreciate, however, that the other embodiments may be practiced without these particular details. Furthermore, one skilled in the art will appreciate that the example embodiments described below do not limit the scope of the present disclosure, and will also understand that various modifications, equivalents, and combinations of the disclosed embodiments and components of such embodiments are within the scope of the present disclosure. Embodiments including fewer than all the components of any of the respective described embodiments may also be within the scope of the present disclosure although not expressly described in detail below. Finally, the operation of well-known components and/or processes has not been shown or described in detail below to avoid unnecessarily obscuring the present disclosure. Also, in the following description components or circuits may be said to be coupled to a voltage or between voltages as a conventional way of succinctly describing the various embodiments, but one skilled in the art will understand that this means such components or circuits are actually coupled to nodes, busses, or other structures that provide the corresponding voltages. In the following description a node may be said to be "pulled down" or driven to a certain voltage, and one skilled in the art will understand that this means that the voltage on that node is pulled or driven to that particular voltage.

The integrated circuit 100 includes core logic circuitry 102 contained in the center of the integrated circuit. The core logic circuitry 102 includes circuitry for performing the desired function of the integrated circuit 100, such as processing circuitry, memory circuitry, digital signal processing circuitry, and so on. The core logic circuitry 102 is surrounded by input/output (I/O) ring circuitry 104 that is coupled to the core logic circuitry and to a number of pins or pads 106 formed around the periphery of the integrated circuit. Only some of pads 106 are labeled to simplify the figure. The I/O ring circuitry 104 communicates signals to and from the core logic circuitry 102 through the pads 106, which interconnect the integrated circuit 100 to other integrated circuits (not shown) or electronic circuitry, as will be appreciated by those skilled in the art.

The I/O ring circuitry 104 includes a number of I/O buffer circuits 108, one of which is shown in FIG. 1. Some or all of the I/O buffer circuits 108 may include level shifter circuits (not shown) for communicating signals to and from the core logic circuitry 102, which has a voltage domain defined by a corresponding supply voltage, and some other circuitry (not shown) coupled to pads 106 and having a different voltage domain. In the example of FIG. 1, this other circuitry would be on another integrated circuit (not shown) but in other embodiments the other circuitry could also be a different functional block of circuitry on the same integrated circuit 100 (i.e., where the integrated circuit 100 includes multiple voltage domains). The I/O buffer circuits 108 may include voltage up level shifters and down level shifters (not shown), as will be explained in more detail below with reference to FIGS. 3 and 4.

Figure 2:
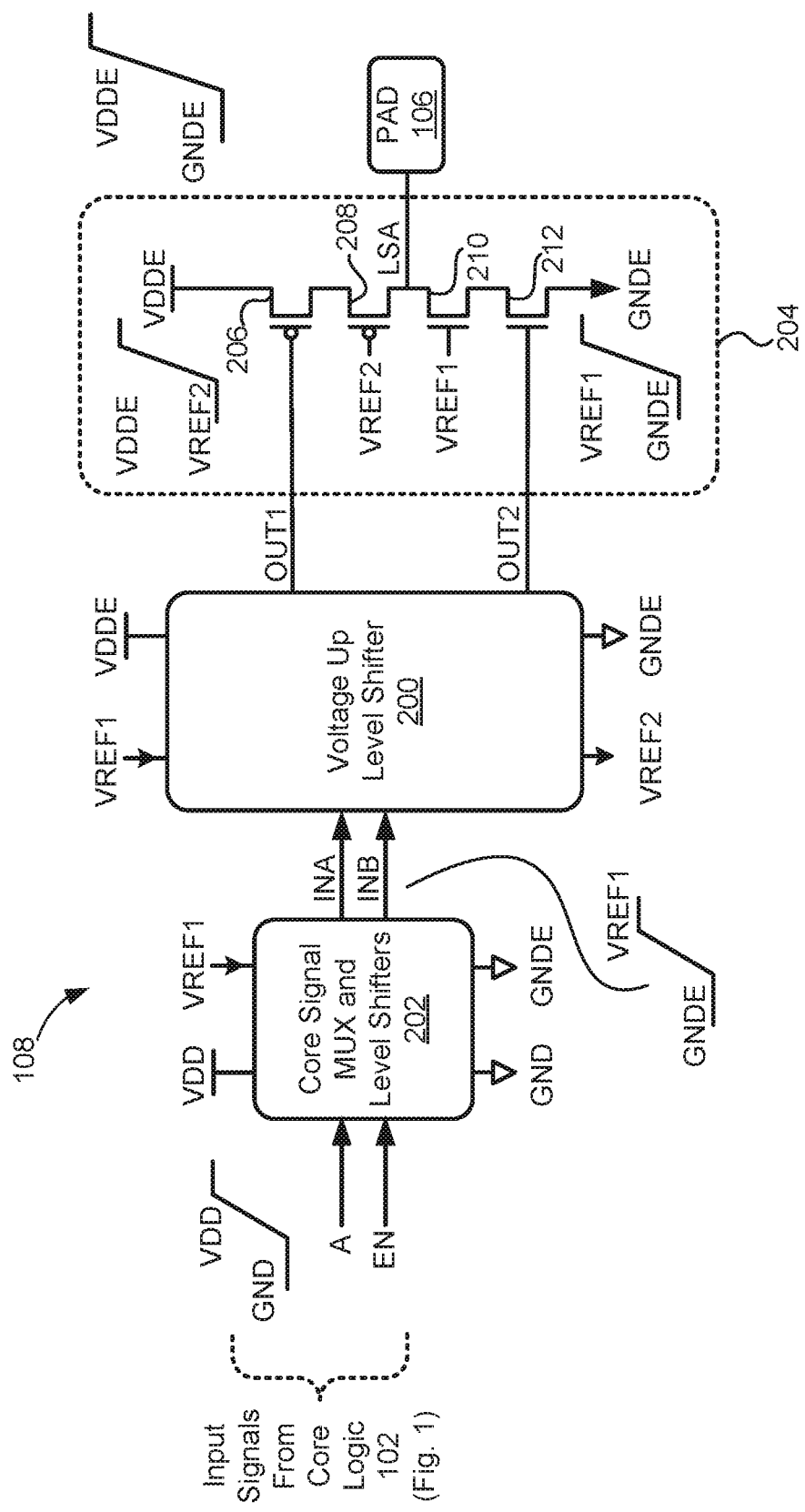
FIG. 2 is a functional block diagram and schematic illustrating in more detail a portion of a single input/output (I/O) buffer of FIG. 1 including a voltage level shifter circuit according to an embodiment of the present disclosure.

FIG. 2 is a functional block diagram and schematic illustrating in more detail a portion of a single input/output (I/O) buffer 108 of FIG. 1 including a voltage up level shifter circuit 200 according to an embodiment of the present disclosure. In the example embodiment of FIG. 2, a core signal multiplexer (MUX) and level shifter circuit 202 receives a logic signal A from the core logic circuitry 102 of FIG. 1. The logic signal A is a binary signal and has a voltage range between a reference supply voltage GND and a supply voltage VDD of the core logic circuitry 102. The core signal MUX and level shifter circuit 202 receives the GND and VDD voltages of the core logic circuitry 102 (FIG. 1) along with a first voltage reference VREF1, a second reference supply voltage GNDE, and an enable signal EN that activates and deactivates the multiplexer (MUX) portion of the circuit.

In the present description, the voltage levels of signals and the logic states of these signals may be used interchangeably. Thus, for example, a signal may be described as being logic high or logic low, or simply high or low, and may also be referred to as being at a specific voltage level or voltage, such as supply voltage VDD. Also, in the present description a signal that is logic high is assumed to be at the higher of the two voltages to which the signal can be driven while a signal that is logic low is at the lower of these two voltages. The converse could be true in other embodiments of the present disclosure, as will be appreciated by those skilled in the art, but this relationship between logic states and voltage levels is assumed herein merely to simplify the present disclosure.

In operation when activated, the level shifter circuit 202 receives the logic signal A from the core logic circuitry 102 (FIG. 1) having the voltage level of either ground GND or the supply voltage VDD of the core logic circuitry. In response to the logic signal A, the level shifter circuit 202 generates complementary logic signals INA, INB. When the logic signal A is high, the level shifter circuit 202 drives the complementary logic signals INA and INB high and low, respectively. The converse is true when the signal A is low. When one of the complementary logic signals INA, INB is high, the signal has the voltage of reference voltage VREF1 while when the signal is low is has the voltage of ground GNDE. The voltages VREF1 and GNDE are voltages in a second voltage domain that is different than the voltage domain of logic signal A and are thus level-shifted signals relative to signal A. In this way the level shifter circuit 202 shifts the level of the signal A from the GND-VDD domain of the core logic or first voltage domain to a second voltage domain having the range GNDE-VREF1 for the INA, INB signals.

The voltage up level shifter circuit 200 according to one embodiment of the present disclosure receives the complementary logic signals INA, INB from the level shifter circuit 202 and generates output signals OUT1, OUT2 in response to the complementary logic signals. The output signals OUT1, OUT2 are applied to an output driver circuit 204 that drives a level-shifted logic signal LSA on a corresponding pad 106 of the integrated circuit 100 of FIG. 1. The voltage up level shifter circuit 200 receives the first reference voltage VREF1, the second reference supply voltage GNDE, a second reference voltage VREF2, and a second supply voltage VDDE. In operation, the voltage up lever shifter circuit 200 performs an "up" level shifting of the INA, INB signals to generate the OUT1, OUT2 signals in a third and second voltage domain, respectively, that is required for driving the output driver circuit 204. The second supply voltage VDDE and second reference supply voltage GNDE are voltages in the fourth voltage domain, with the first voltage domain being that of the logic signal A, the second voltage domain being that of the INA, INB signals and the third voltage domain being that of the OUT1 signal. The reference voltages VREF1, VREF2 are utilized so as not to damage MOS transistors forming the circuits 200-204 in level shifting the logic signal A from the first voltage domain to generate the level-shifted logic signal LSA in a fourth voltage domain, as will be explained in more detail below with reference to FIGS. 3 and 4.

The output drive circuit 204 includes series-connected PMOS transistors 206 and 208 and series-connected NMOS transistors 210 and 212 connected in series between the second supply voltage VDDE and second reference supply voltage GNDE as illustrated in FIG. 2. These transistors 206-212 operate responsive to the OUT1, OUT2 signals to drive the level-shifted logic signal LSA on the pad 106. The PMOS transistor 206 receives the OUT1 signal and when activated couples the pad 106 to the supply voltage VDDE through PMOS transistor 208. Similarly, the NMOS transistor receives the OUT2 signal and when activated couples the pad 106 to the reference supply voltage GNDE through NMOS transistor 210. The MOS transistors 208 and 210 receive the reference voltages VREF2 and VREF1 on their respective gates and function during operation of the driver circuit 204 to prevent the full supply voltage VDDE from being applied across the junctions of any of the transistors 206-212, which could damage these transistors as will be appreciated by those skilled in the art. The level-shifted logic signal LSA is a logic signal in a fourth voltage domain and has the voltage range GNDE-VDDE, meaning the LSA signal has the voltage level VDDE (logic high) or GNDE (logic low) depending on the value of the logic signal A.

In operation, the voltage up level shifter circuit 200 generates the level-shifted output signal OUT1 and the unshifted output signal OUT2 in response to the complementary logic signals INA, INB. The up level shifter circuit 200 thus generates the OUT1 signal in the third voltage domain having the range VREF2-VDDE and generates the OUT2 signal in the second domain GNDE-VREF1 from the level shifter 202. In response to the OUT1, OUT2 signals, the output driver circuit 204 drives the level-shifted logic signal LSA on the pad 106 either high to the supply voltage VDDE or low to the reference supply voltage GNDE. More specifically, when the logic signals INA and INB are low and high, respectively, the level shifter circuit 200 drives the output signals OUT1 and OUT2 low. When the OUT1 signal is low, the PMOS transistor 206 turns ON, driving the level-shifted logic signal LSA on the pad 106 high (i.e., to approximately VDDE) through transistors 206 and 208. When the OUT1 signal is low the OUT2 signal is also low, turning OFF the NMOS transistor 212 such that transistor 210 is isolated from reference voltage GNDE and does not affect the voltage on the pad 106. Conversely, when the logic signals INA and INB are high and low, respectively, the level shifter circuit 200 drives the output signals OUT1 and OUT2 both high. When the OUT1 signal is high the PMOS transistor 206 is turned OFF, isolating the PMOS transistor 208 from the supply voltage VDDE so that it does not affect the voltage on the pad 106. When the OUT1 signal is high the OUT2 signal is also high, which turns ON the NMOS transistor 212 and drives the level-shifted logic signal LSA on the pad 106 to the reference supply voltage GNDE through transistors 212 and 210. In this way, the output driver circuit 204 generates the level-shifted logic signal LSA on the pad 106, where the LSA signal is in the fourth voltage domain defined by the voltage range GNDE-VDDE.

Figure 3:
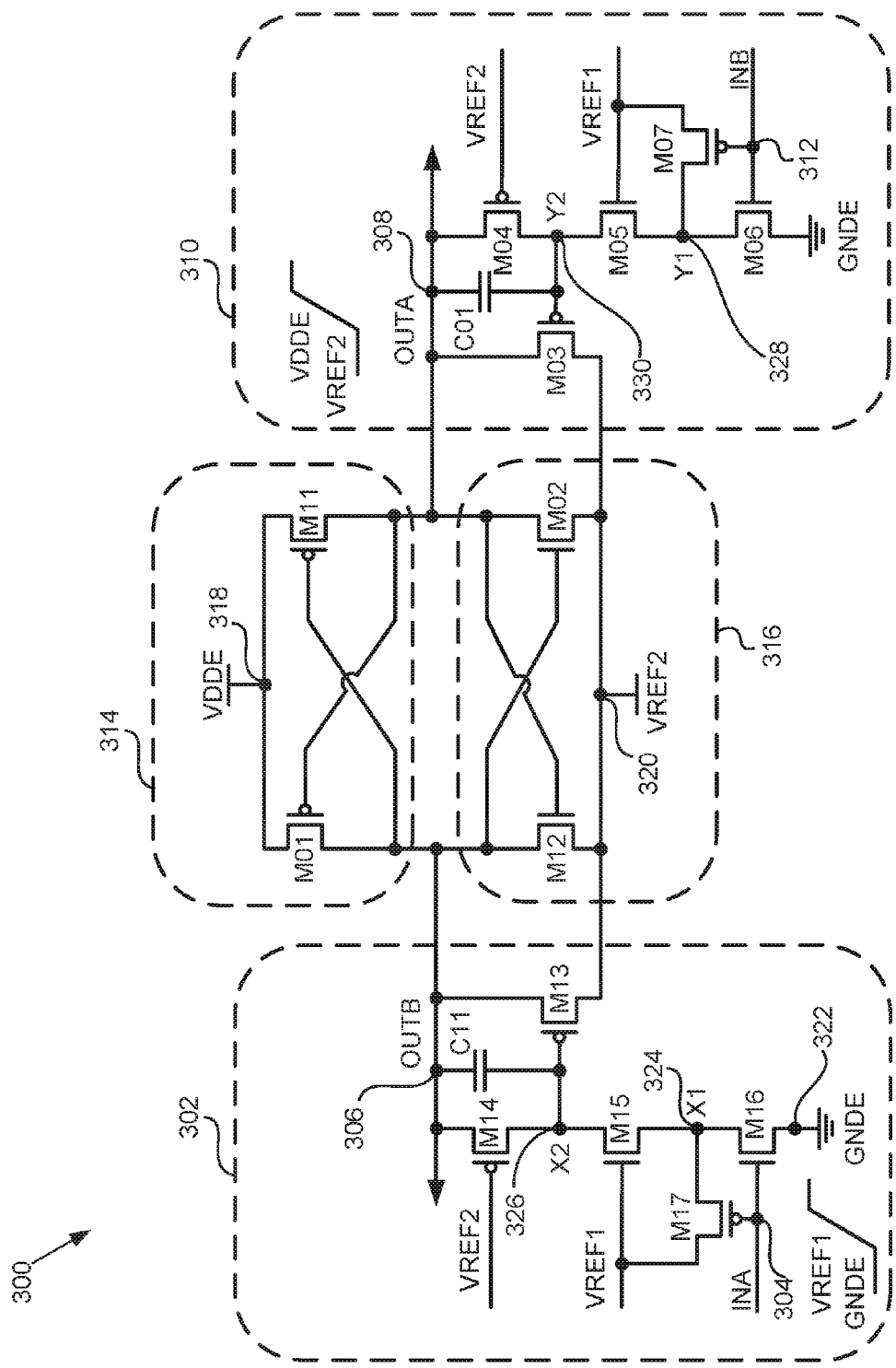
FIG. 3 is a schematic of a voltage range up level shifter of FIG. 2 according to one embodiment of the present disclosure.

FIG. 3 is a schematic of an up level shifter circuit 300 that may be used in the up level shifter 200 of FIG. 2 according to one embodiment of the present disclosure. The up level shifter circuit 300 includes a first input signal write circuit 302 that receives a complementary input signal INA on an input node 304, where the complementary input signal is in a second voltage domain defined a supply reference voltage GNDE and a first reference voltage VREF1. The first input signal write circuit 302 is operable to cause a complementary output signal OUTB on a complementary output node 306 to be driven low to a second reference voltage VREF2 and to cause a complementary output signal OUTA on a complementary output node 308 to be driven to a supply voltage VDDE. The OUTA and OUTB signals are in a third voltage domain defined by the second reference voltage VREF2 and the supply voltage VDDE. Similarly, a second input signal write circuit 310 receives a complementary input signal INB on an input node 312, where the complementary input signal is in the second voltage domain defined the voltages GNDE and VREF1. The second input signal write circuit 310 is operable to cause a complementary output signal OUTA on the complementary output node 308 to be driven low to the second reference voltage VREF2 and to cause the complementary output signal OUTB on the output node 306 to be driven high to the supply voltage VDDE. The reference voltages VREF1 and VREF2 are internal reference voltages that are used to protect the MOS devices in the level shifter circuit 300 from excess voltage stress. The relationship between the values of the reference supply voltage GNDE, supply voltage VDDE, first reference voltage VREF1, and second reference voltage VREF2 will be discussed in more detail below with reference to FIGS. 5-7.

The up level shifter circuit 300 further includes a strong latch circuit 314 that is coupled between the supply voltage VDDE and the complementary output nodes 306, 308 and operates to latch one of the complementary output signals OUTA, OUTB on these nodes high to the supply voltage VDDE. A weak latch 316 is coupled between the second reference voltage VREF2 and the complementary output nodes 306, 308 and operates to latch one of the complementary output signals OUTA, OUTB on these nodes low to the second reference voltage VREF2.

In operation, assume the complementary input signals INA and INB applied to the up level shifter circuit 300 are low and high, respectively, and the complementary output signals OUTA and OUTB are low and high, respectively. Now assume the complementary input signals INA and INB transition high and low, respectively. In response to the low INB signal, the second input signal write circuit 310 is deactivated and does not affect the voltage on the output node 308 or the generation of the complementary output signals OUTA, OUTB. In response to the high INA signal, the write circuit 302 begins pulling low the OUTB signal on the output node 306, which is initially high at a value of approximately the supply voltage VDDE. As soon as the voltage of the OUTB signal is sufficiently low, the strong latch circuit 314 functions to drive the OUTA signal on the node 308 high. Once the voltage of the OUTA signal is sufficiently high the weak latch circuit 316 is activated and drives or latches the OUTB signal low. Thus, at this point in response to the INA and INB signals going high and low, respectively, the OUTA signal is driven high to approximately the supply voltage VDDE by the strong latch circuit 314 and the OUTB signal is driven low to approximately the second reference voltage VREF2 by the weak latch circuit 316.

Now assume the complementary input signals INA and INB transition low and high, respectively. In response to the low INA signal, the first input signal write circuit 302 is deactivated and does not affect the voltage on the output node 306 or the generation of the complementary output signals OUTA, OUTB. In response to the high INB signal, the write circuit 310 begins pulling low the OUTA signal on the output node 308, which is initially high at approximately the supply voltage VDDE. As soon as the voltage of the OUTA signal is sufficiently low, the strong latch circuit 314 functions to drive the OUTB signal on the node 306 high. Once the voltage of the OUTB signal is sufficiently high the weak latch circuit 316 is activated and drives or latches the OUTA signal low. Thus, responsive to the INA and INB signals going low and high, respectively, the OUTB signal is driven high to approximately the supply voltage VDDE by the strong latch circuit 314 and the OUTA signal is driven low to approximately the second reference voltage VREF2 by the weak latch circuit 316.

The detailed structure and operation of the strong latch circuit 314, weak latch circuit 316, the first input signal write circuit 302 and second input signal write circuit 310 will now be described in more detail with reference to the embodiment of FIG. 3. Recall, as discussed above the level shifting function of the level shifter circuit 300 from the voltage range or domain of the input signals INA, INB (i.e., GNDE-VREF1) to the voltage range or domain of the output signals OUTA, OUTB (i.e., VREF2-VDDE) must not result in damage to the components forming the latch circuits 314 and 316 and write circuit 302 and 310 due to the voltage stress tolerance limits of the components being exceeded. Unlike prior art level shifter circuits, the level shifter circuit 300 does not require reprogramming or reconfiguration to accommodate changes in the supply voltage VDDE, as will be understood from the detailed description of the circuits 302, 310, 314 and 316 set forth below.

The strong latch circuit 314 includes a cross-coupled pair of PMOS transistors M01 and M11 coupled between a first supply voltage node 318 and the output node 306 and output node 308, respectively. Similarly, the weak latch circuit 316 includes a cross-coupled pair of NMOS transistors M02 and M12 coupled between a first reference voltage node 320 that receives the second reference voltage VREF2 and the output nodes 308 and 306, respectively. In the strong latch circuit 314 the PMOS transistors M01, M11 have the characteristic that they provide more drain-to-source current than do NMOS transistors M02, M12 of the weak latch circuit 316, and thus the latch circuit 314 is termed a "strong" latch circuit. Typically the size of the PMOS transistors M01, M11 is larger than the size of the MOS transistors M02, M12 in the weak latch circuit 316 so that each of the transistors M01, M11 provides a larger current to corresponding output node 306, 308 than does the NMOS transistor M02, M12.

As will be appreciated by those skilled in the art, the physical characteristics of a MOS transistor such as the length and width of the channel of the transistor may be varied to change the electrical characteristics of the transistor. Alternatively, materials forming the various regions of the PMOS transistors M01, M11 or the doping levels of such regions may also be varied such that these transistors provide more current than do the NMOS transistors M02, M12 in the weak latch circuit 316. Thus, the term "strong" indicates that the latch circuit 314 and at least some of the components forming that latch circuit, such as the PMOS transistors M01, M11 in the embodiment of FIG. 3, provide more current than do the NMOS transistors M02, M12 in the weak latch circuit 316. Thus, the terms "strong" and "weak" are used in relation to the transistors in the latch circuits 314 and 316. In the embodiment of FIG. 3, all the PMOS transistors, including transistor M01, M11 in the strong latch circuit 314, are larger than all the NMOS transistors in the level shifter circuit 300 including the NMOS transistors M02, M12 in the weak latch circuit 316. In other embodiments, the PMOS transistors M01, M11 need not be larger or "stronger" than all the NMOS transistors in the level shifter circuit 300 but they are stronger than the NMOS transistors M02, M12 in the weak latch circuit 316.

The first input signal write circuit 302 includes a PMOS transistor M14 and two NMOS transistors M15, M16 coupled in series between the complementary output node 306 and a reference supply voltage node 322 and function collectively to pull down the voltage level of OUTB signal on the output node 306 when the INA signal is high, as will be described more detail below. The gate of NMOS transistor M16 receives the INA signal while the gate of the PMOS transistor M14 receives the second reference voltage VREF2 and the gate of NMOS transistor M15 receives the first reference voltage VREF1. Another PMOS transistor M17 is coupled between the gate of the NMOS transistor M15 and a first intermediate node 324 defined between transistors M15 and M16, with the gate of the PMOS transistor M17 receiving the INA signal. This PMOS transistor M17 functions when the INA signal is low to turn off a PMOS transistor M13 coupled between the output node 306 and the first reference voltage node 320 so that the OUTB signal may be latched high to the supply voltage VDDE, as will be described in more detail below. A capacitor C11 is coupled between the output node 306 and the gate of the PMOS transistor M13 and functions to protect the PMOS transistors M13, M14 from experiencing voltages that exceed the maximum stress voltage of these devices during the transition of the OUTB signal from one voltage level to another, as will be explained in more detail below.

The detailed operation of the MOS transistors in the first input signal write circuit 302 and the latches 314 and 316 will now be provided with reference to FIG. 3. In operation, the transistors M11-M16 in these circuits 302, 314, 316, 310 function to write a logic high (i.e., VDDE) for the OUTA signal on node 308 while the transistors M01-M06 function to write a logic low (i.e., VREF2) for the OUTB signal on node 306. Initially assume INA is logic low (GNDE) and INB is logic high (VREF1) correspondingly OUTA will be at logic low (VREF2) and OUTB will at logic high (VDDE). For writing the OUTA signal to a logic low and the OUTB signal to a logic high the operation of these groups of transistors is reversed, namely transistors M01-M06 function to write a logic high for the OUTB signal and transistors M11-M16 function to write a logic low for the OUTA signal.

Initially, assume the INA signal is low (i.e., GNDE) and the INB signal is high (i.e., VREF1), meaning that the OUTA signal is low (i.e., VREF2) and the OUTB signal is high (i.e., VDDE). When the INA signal transitions from low to high the INB signal at the same time transitions from high to low (i.e., INA and INB are complementary signals). In response to the INA signal going high, the NMOS transistor M16 turns on and responsive to the INB signal going low the NMOS transistor M06 in the second input signal write circuit 310 turns off. The operation of the write circuit 310 responsive to the INB signal going low and NMOS transistor M16 will be discussed in more detail below.

Continuing now with the operation of the first input signal write circuit 302 responsive to the INA signal going high, when the NMOS transistor M16 turns ON this pulls down the voltage on the first intermediate node 324 towards the reference supply voltage GNDE, which causes the NMOS transistor M15 to turn on. Responsive to transistor M15 turning on the voltage on the second intermediate node 326 is pulled down or lowered, which turns on the transistor M13 harder. The voltage of the OUTB signal on the node 306 is initially high (VDDE) and when PMOS transistor M13 turns on harder this starts reducing the voltage on the output node 306 as the charge on this node is discharged through the PMOS transistor M13 to the first reference voltage node 320 at voltage VREF2. Also note that the voltage on the second intermediate node 326 being pulled down results in the PMOS transistor M14 turning on, which also discharges the output node 306 through transistors M14, M15, M16. Thus, the output node 306 is discharged through PMOS transistor M13 and through transistors M14-M16 to start driving the OUTB signal low (VREF2). These turned on or activated transistors M13 and M14-M16 pull the output node 306 towards the higher of the voltages VREF2 and the threshold voltage Vtp of the PMOS transistors M13, M14.

Once the OUTB signal on output node 306 goes lower than the threshold voltage Vtp of the PMOS transistors, the PMOS transistor M11 turns on and charges or drives the OUTA signal on the output node 308 high to the supply voltage VDDE. In this way, the strong latch circuit 314 latches the OUTA signal high in response to the INA signal going high and the subsequent operation of transistors M13-16 in the first write signal circuit 302 as just described above. The PMOS transistor M11 in the strong latch circuit 314 is stronger than the NMOS transistor M02 in the weak latch circuit 316, and thus even if the NMOS transistor M02 is initially turned on when the PMOS transistor M11 turns on the output node 308 is quickly charged through the PMOS transistor M11 to thereby drive the OUTA signal high (i.e., to VDDE). As the output node 308 is charged through the PMOS transistor M11 and the voltage on this node increases, the NMOS transistor M12 in the weak latch circuit 316 turns on to thereby latch the OUTB signal on output node 306 low (VREF2). In this way the strong latch circuit 314 latches the OUTA signal high through PMOS transistor M11 and the weak latch circuit 316 latches the OUTB signal low through NMOS transistor M12. As the first input signal write circuit 302 pulls down the voltage on the output node 306 the NMOS transistor M02 in the weak latch circuit 316 turns off, meaning at this point in the weak latch circuit the NMOS transistor M12 is turned on and the NMOS transistor M02 is turned off. Similarly in the strong latch circuit 314, as the PMOS transistor M11 turns on and drive the output node 308 high the PMOS transistor M01 in the strong latch circuit turns off, which means that the same is true for the strong latch circuit as was true for the weak latch circuit 316, namely one transistor (PMOS M11) is turned on and the other transistor (PMOS M01) is turned off. In this way, in response to the INA and INB signals going high and low the latch circuits 302 and 310 latch the OUTA and OUTB signals high and low, respectively.

Finally, the operation of the second input signal write circuit 310 will now be described in this situation where the INB signal applied to the circuit is low. The low INB signal effectively turns off the write circuit 310 so that it does not affect the voltage on the output node 308 and thus does not affect the value of the OUTA signal. This is true because in response to the low INB signal the NMOS transistor M06 turns off. The function of the PMOS transistor M07 is to turn off the PMOS transistor M03 when the INB signal is low, as will now be described in more detail. This is necessary because, as discussed above, the PMOS transistor M11 is charging the output node 308 to VDDE to drive the OUTA signal high and could not do so or would waste power in doing so if the PMOS transistor M03, which is a larger sized transistor, is not turned off before the PMOS transistor M11 turns on.

The way in which the PMOS transistor M07 turns off the PMOS transistor M03 is as follows. The low (GNDE) INB signal, which turns off the NMOS transistor M06, also turns on the PMOS transistor M07 so that a first intermediate node 328 is driven to approximately the reference voltage VREF1. As a result of the voltage VREF1 on the node 328, the NMOS transistor M05 turns on in a reverse direction and drives a second intermediate node 330 the reference voltage VREF1 minus the threshold voltage Vtn of the NMOS transistor M05. In this situation, although the source of the NMOS transistor M05 is connected to node 328 and the drain to node 330 the functional operation of the transistor effectively switches such that the device operates in a "reverse direction" with the node 328 effectively being the drain and the node 330 effectively being the source. In this way, the NMOS transistor M05 drives the voltage on the node 330 to (VREF1-Vtn). Since the voltage on the output node 308 is initially low (VREF2) this voltage (VREF1-Vtn) on the node 330 sufficiently turns off the PMOS transistor M03 so that output node 308 can be quickly charged to thereby drive the OUTA signal high (VDDE). Once the PMOS transistor M11 drives the OUTA signal high to the supply voltage VDDE, the intermediate node 330 will also be driven to the supply voltage VDDE through the PMOS transistor M04, ensuring that the PMOS transistor M03 is turned off completely.

The up level shifter circuit 300 may be level shifting the OUTA, OUTB signals to voltage levels that exceed the maximum voltage that may be applied across junctions of the MOS transistors forming the up level shifter circuit. Exceeding this maximum stress voltage could damage the MOS transistors and render the upper level shifter circuit 300 inoperable. As a result, the first and second input signal write circuits 302 and 310 are designed to automatically prevent any such damage from occurring. In the write circuits 302, 310, the transistors M05 and M15 are used to protect the devices M06 and M16 respectively from overvoltage stresses when VDDE is higher than the nominal operating voltage of the MOS devices. The NMOS transistor M05 protects the NMOS transistor M06 in the write circuit 310 by ensuring that the voltage on the node 328 (source of transistor M05) is always less than or equal to the reference voltage VREF1 (the node 328 will be pulled up to VREF1 level by PMOS transistor M07 when this transistor is turned on). In this way the NMOS transistor M05 protects the NMOS transistor M06 from high voltage stresses that could otherwise result if the node 328 (i.e., the drain of M06) was to go to a large enough voltage as could occur when the supply voltage VDDE is higher than the nominal operating voltage of the NMOS transistor M06. Similarly, the NMOS transistor M15 in the write circuit 302 functions in the same to protect NMOS transistor M16 in this write circuit.

Now the function of the PMOS transistor M04 in the second input signal write circuit 310 will be described in more detail. The PMOS transistor M04 is utilized to protect the PMOS transistors M01 and M11 in the strong latch circuit 314 from experiencing a voltage that is higher than the maximum stress voltage when the supply voltage VDDE is greater than the nominal operating voltage of the MOS transistors. More specifically, the PMOS transistor M04 ensures that the voltage on the source of this transistor (i.e., on the output node 308) is always higher than the reference voltage VREF2. In this way, it protects the PMOS transistors M01 and M11 by ensuring that the gate to source voltage and the drain to source voltage across these devices never exceeds (VDDE-VREF2), which does not overstress the MOS transistors since the value of the reference voltage VREF2 is selected to ensure that (VDDE-VREF2) does not exceed the maximum stress voltage of the MOS devices. If the PMOS transistor M04 was not included the node 330 would be connected to node 308 and hence OUTA could go down to the voltage GNDE level through transistors M05 and M06, which would create a gate to source voltage across transistor M01 and a drain to source voltage across transistor M11 that is equal to VDDE-GNDE, which is higher than the voltage stress tolerance limit of the transistors M01 and M11 when VDDE is higher than the nominal operating voltage of the devices. The PMOS transistor M14 in the first input signal write circuit 302 functions in the same way to protect the PMOS transistors M01 and M11 from experiencing a voltage that exceeds the maximum stress voltage of these MOS devices.

Now the function of the capacitor C11 in protecting the PMOS transistors M13, M14 will be described in more detail. The capacitor C11 protects the PMOS transistors M13 and M14 from experience voltages that exceed the maximum stress voltage during the logic high to logic low transition of the OUTB signal on the output node 306. When the NMOS transistors M15 and M16 is turn on this will discharge the node 326 very quickly, while the discharging of the output node 306 will be slower due to PMOS transistor M01 in the strong latch circuit 314 initially driving the output node high. Thus, the voltage at node 326 could quickly approach ground voltage GNDE while the voltage on the output node 306 is still at VDDE, which would exceed the maximum stress voltage of the PMOS transistors M13, M14. The capacitor C11 prevents this from occurring by slowing down the discharging of the node 326 and by increasing rate of discharge of the output node 306 due to capacitive coupling. The capacitor C11 in this way not only protects the transistors M13 and M14 but increases the speed of operation of the up level shifter circuit 300. During the relatively fast transition of the OUTB signal on node 306 the capacitor C11 will work as low impedance path in parallel with the transistor M14. This reduces the effective impedance between the node 306 and the node 326 during the transition and in this way the capacitor C11 accelerates the discharging of the node 306 and reduces the effective voltage drop between this node and the node 326. The capacitor C11 also slows the discharging of the node 326 because the transistors M15 and M16 now need to pull down the additional charge on the node 326 provided by the capacitor C11 during the transition. The capacitor C01 in the write circuit 310 functions in a similar way to protect the PMOS transistors M03, M04 and improve the speed of the low to high transition of the OUTA signal on the output node 308.

Figure 4:
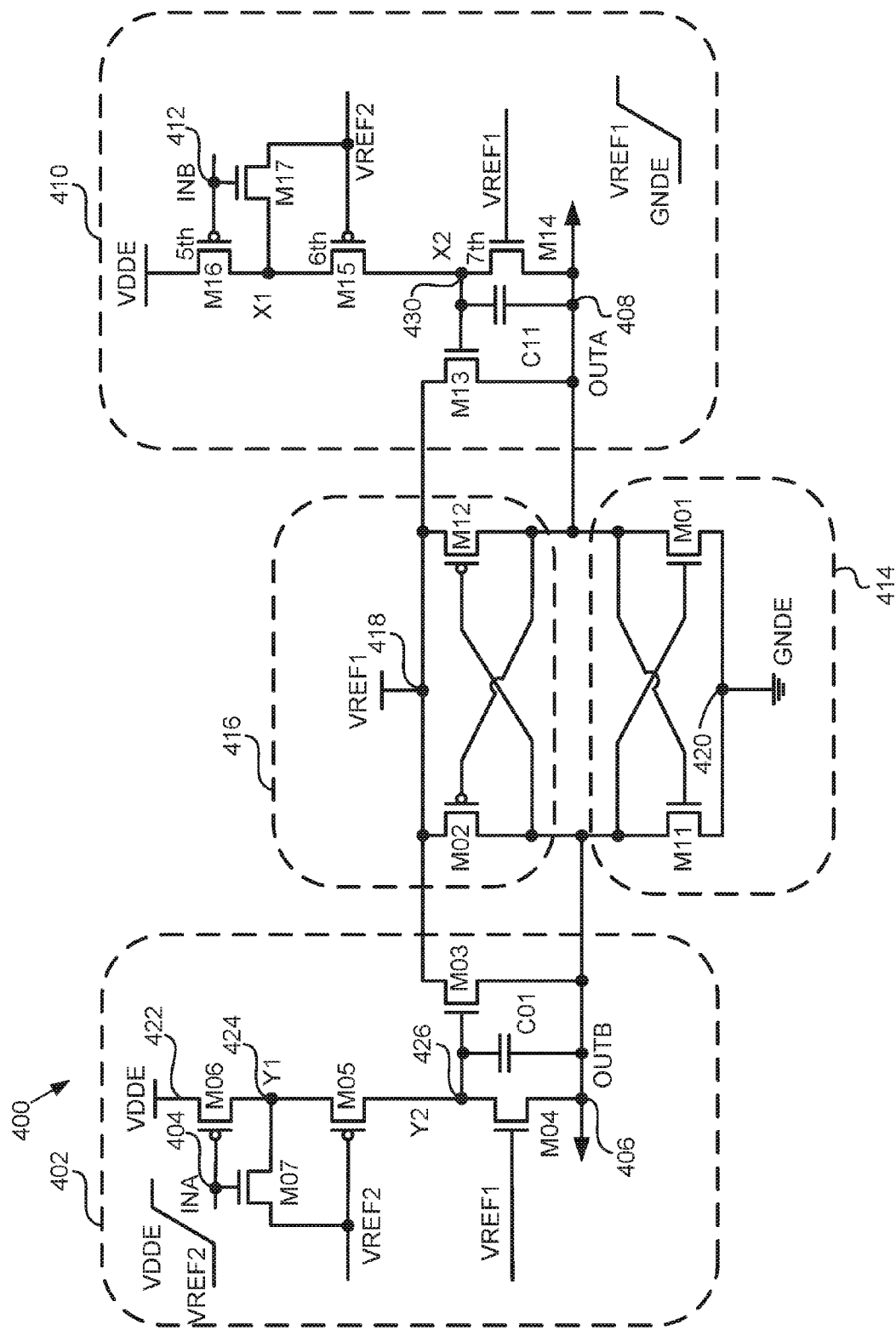
FIG. 4 is a schematic of a voltage range down level shifter according to another embodiment of the present disclosure.

FIG. 4 is a schematic of a down level shifter circuit 400 that may be used in the buffer circuit 108 of FIG. 2 according to one embodiment of the present disclosure. The down level shifter circuit 400 would typically be utilized, for example, in the I/O buffer circuit 108 of FIG. 2 for communicating signals from the pad 106 to the core logic circuitry 102 of FIG. 1. Thus, the down level shifter circuit 400 would be utilized for communicating signals in the opposite direction as shown in FIG. 2. The down level shifter circuit 400 includes a first input signal write circuit 402 that receives a complementary input signal INA on an input node 404, where the complementary input signal is in a first voltage domain defined a supply voltage VDDE and a reference voltage VREF2. The first input signal write circuit 402 is operable to cause a complementary output signal OUTB on a complementary output node 406 to be driven high to a reference voltage VREF1 and to cause a complementary output signal OUTA on a complementary output node 408 to be driven low to a supply reference voltage GNDE.

The OUTB signal is in a second voltage domain defined by the reference voltage VREF1 and the supply reference voltage GNDE. Similarly, a second input signal write circuit 410 receives a complementary input signal INB on an input node 412, where the complementary input signal is in the first voltage domain defined the voltages VREF2 and VDDE. The second input signal write circuit 410 is operable to cause a complementary output signal OUTA on the complementary output node 408 to be driven high to the reference voltage VREF1 and to cause the complementary output signal OUTB on the output node 406 to be driven low to the supply reference voltage GNDE. The level shifter circuit 400 is termed a "down" level shifter because the first voltage domain (VREF2-VDDE) includes the supply voltage VDDE, which is higher than the voltages of the second voltage domain (GNDE-VREF1) so the circuit is said to be shifting the voltage levels "down" from the first voltage domain to the second voltage domain.

The down level shifter circuit 400 further includes a strong latch circuit 414 that is coupled between the supply reference voltage GNDE and the complementary output nodes 406, 408 and operates to latch one of the complementary output signals OUTA, OUTB on these nodes low to the supply reference voltage GNDE. A weak latch 416 is coupled between the reference voltage VREF1 and the complementary output nodes 406, 408 and operates to latch one of the complementary output signals OUTA, OUTB on these nodes high to the reference voltage VREF1.

The down level shifter circuit 400 also includes elements 418-430, C01 and C11 as seen in FIG. 4, where these elements correspond to the elements 318-330, C01 and C11 in the up level shifter circuit 300 of FIG. 3. The function of each of these individual components 418-430, C01 and C11 is analogous to the function for the corresponding component described with reference to the up level shifter circuit 300 of FIG. 3. Thus, for the sake of brevity, the detailed operation of these components for elements 418-430, C01, C11 will not be described in further. The same is true of the overall operation of the down level shifter circuit 400, and thus, once again, for the sake of brevity, this overall operation will not be described in detail and will be understood by those skilled in the art in view of the detailed description of the overall operation and functionality of individual elements of the up level shifter circuit 300 of FIG. 3.

Figure 5:
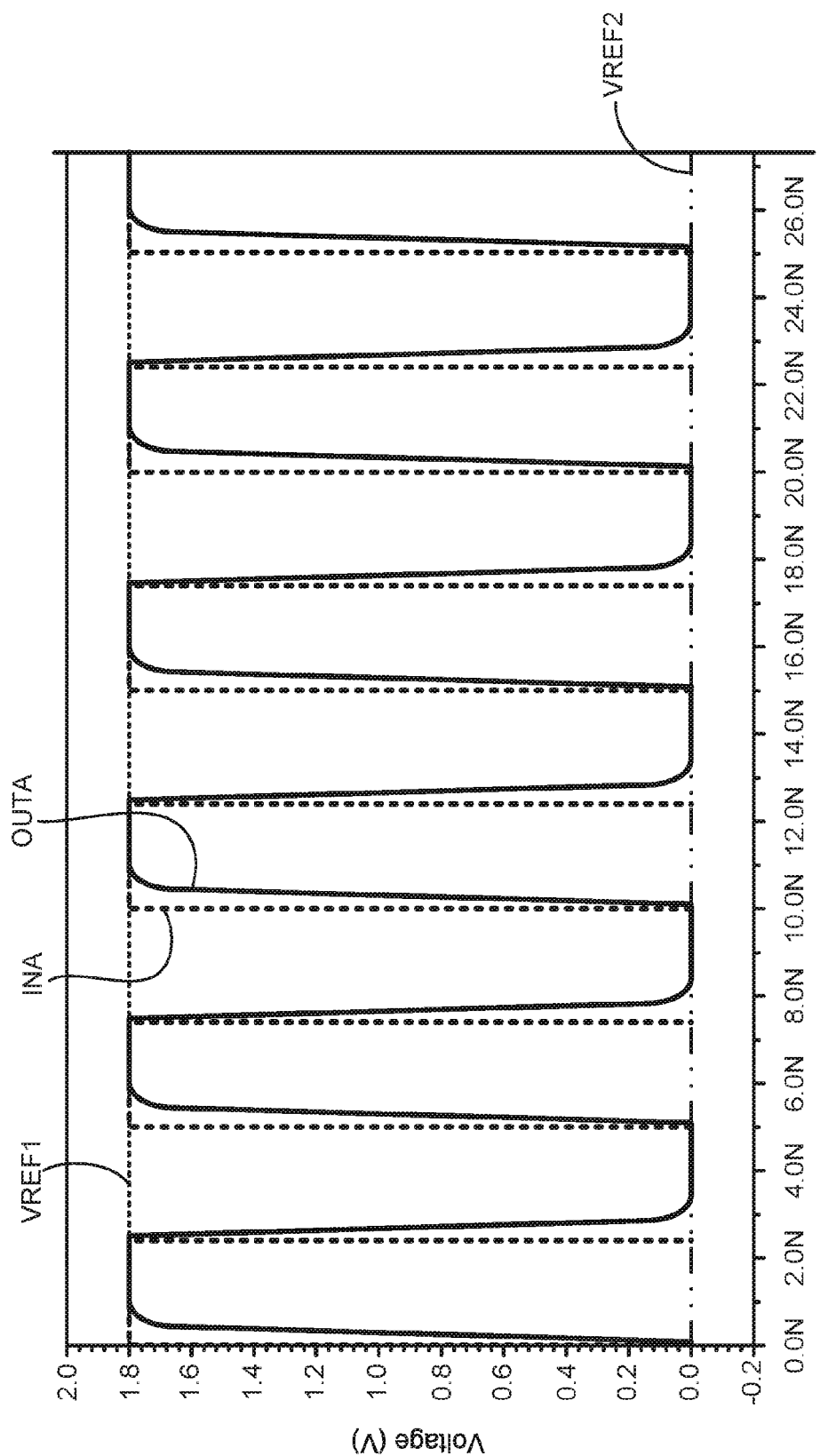
FIG. 5 is a graph illustrating signals of the voltage range up level shifter of FIG. 3 during operation of the level shifter according to one embodiment of the present disclosure.

FIG. 5 is a graph illustrating signals of the up level shifter circuit 300 of FIG. 3 during operation according to one embodiment of the present disclosure. The graph shows time along the horizontal axis and voltage along the vertical axis. This embodiment illustrates the relationship between the values of the reference supply voltage GNDE, supply voltage VDDE, first reference voltage VREF1, and second reference voltage VREF2 according to one embodiment of the level shifter circuit 300. In this embodiment, the first internal reference voltage VREF1 equals the supply voltage VDDE (VREF1=VDDE) and the second reference voltage VREF2 equals the supply reference voltage GNDE (VREF2=GNDE). The supply voltage VDDE equals 1.8V in the example of FIG. 5. Thus, in this embodiment the first voltage domain of the INA, INB signals (GNDE-VREF1) is the same as the second voltage domain of the OUTA, OUTB signals (VREF2-VDDE) because GNDE=VREF2=0V and VREF1=VDDE=1.8V. Only the INA and OUTA signals are shown in FIG. 5. Accordingly, in the example of FIG. 5 the level shifter circuit 300 is not truly functioning as a level shifter because the first and second voltage domains are the same. As seen in the graph of FIG. 5, the OUTA signal is slightly delayed relative to but tracks the INA signal, as previously described with reference to the level shifter circuit 300 of FIG. 3.

Figure 6:
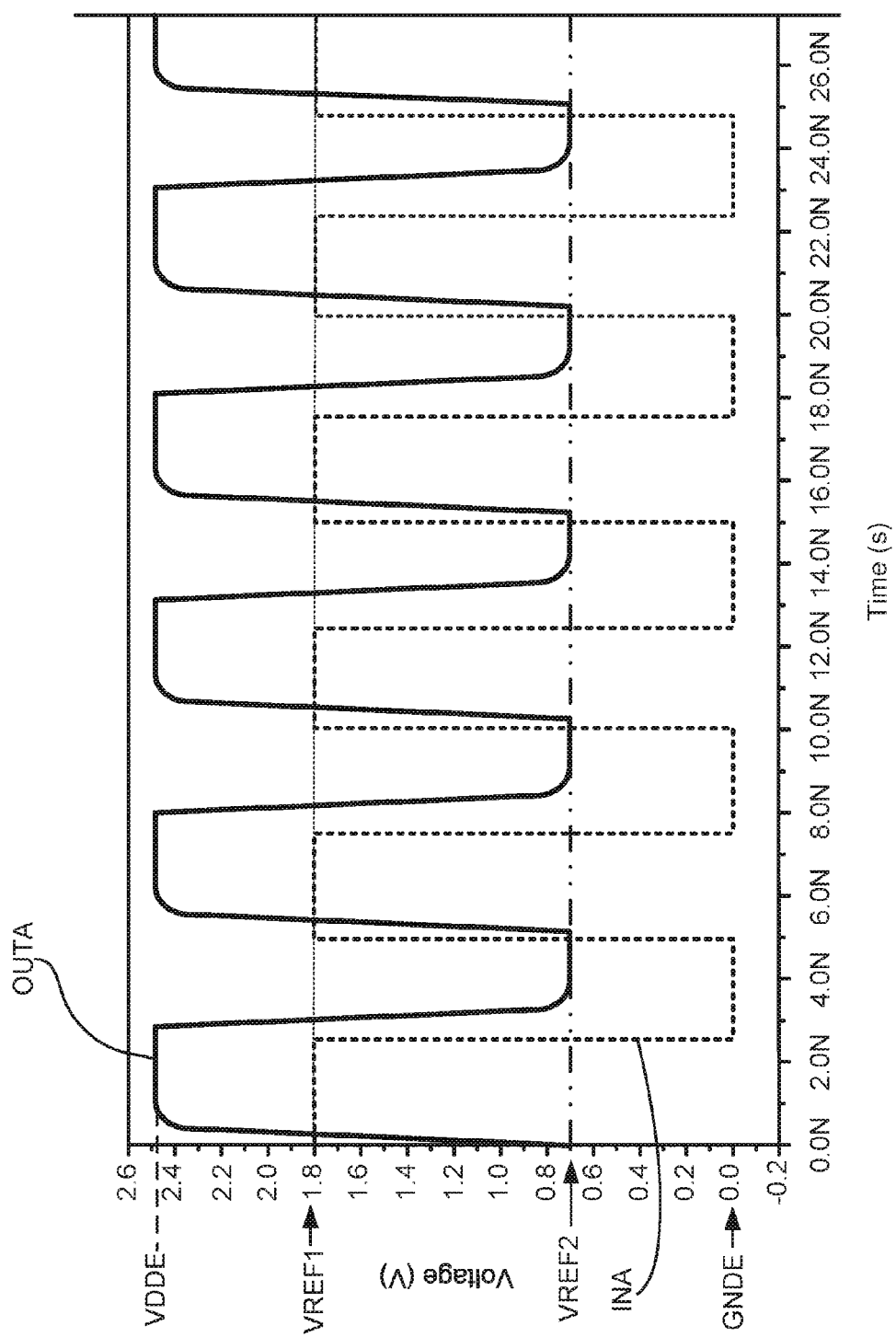
FIG. 6 is a graph illustrating signals of the voltage range up level shifter of FIG. 3 during operation of the level shifter according to another embodiment of the present disclosure.

FIG. 6 is a graph illustrating signals of the up level shifter circuit 300 of FIG. 3 during operation of the level shifter according to another embodiment of the present disclosure. Once again, the graph shows time along the horizontal axis and voltage along the vertical axis. In this embodiment, the up level shifter circuit 300 is performing an up level shift of the input signals INA, INB. The first internal reference voltage VREF1 equals 1.8V, the supply voltage VDDE equals 2.5V, the second reference voltage VREF2 equals 0.7V, and the supply reference voltage GNDE equals 0V. Thus, in this embodiment the first voltage domain of the INA, INB signals (GNDE-VREF1) is equal to the voltage range (0V-1.8V) while the second voltage domain for the OUTA, OUTB signals is equal to the voltage range (0.7V-2.5V). Only the INA and OUTA signals are shown in FIG. 6. As seen in the graph of FIG. 6, the OUTA signal is slightly delayed relative to but tracks the INA signal. The internal reference voltages VREF1 and VREF2 are generated centrally by using a programmable reference generator in such a way that VREF1=($\alpha$×VDDE) and VREF2=($\beta$×VDDE), where $\alpha$ and $\beta$ are each less than one (1) and are selected so that VREF1 and VREF2 have the desired values to properly protect the MOS devices of the I/O buffer of FIG. 2, up level shifter circuit 300 of FIG. 3 and the down level shifter circuit 400 of FIG. 4. For optimal performance, VREF2=(VDDE−VREF1) such that (VREF1+VREF2)=VDDE. In the example of FIG. 6, $\alpha$=0.72 and $\beta$=0.28. When VREF2=VDDE−VREF1, both the NMOS and PMOS devices in the circuit will see equal overdrive voltage across them and hence give optimal performance.

Figure 7:
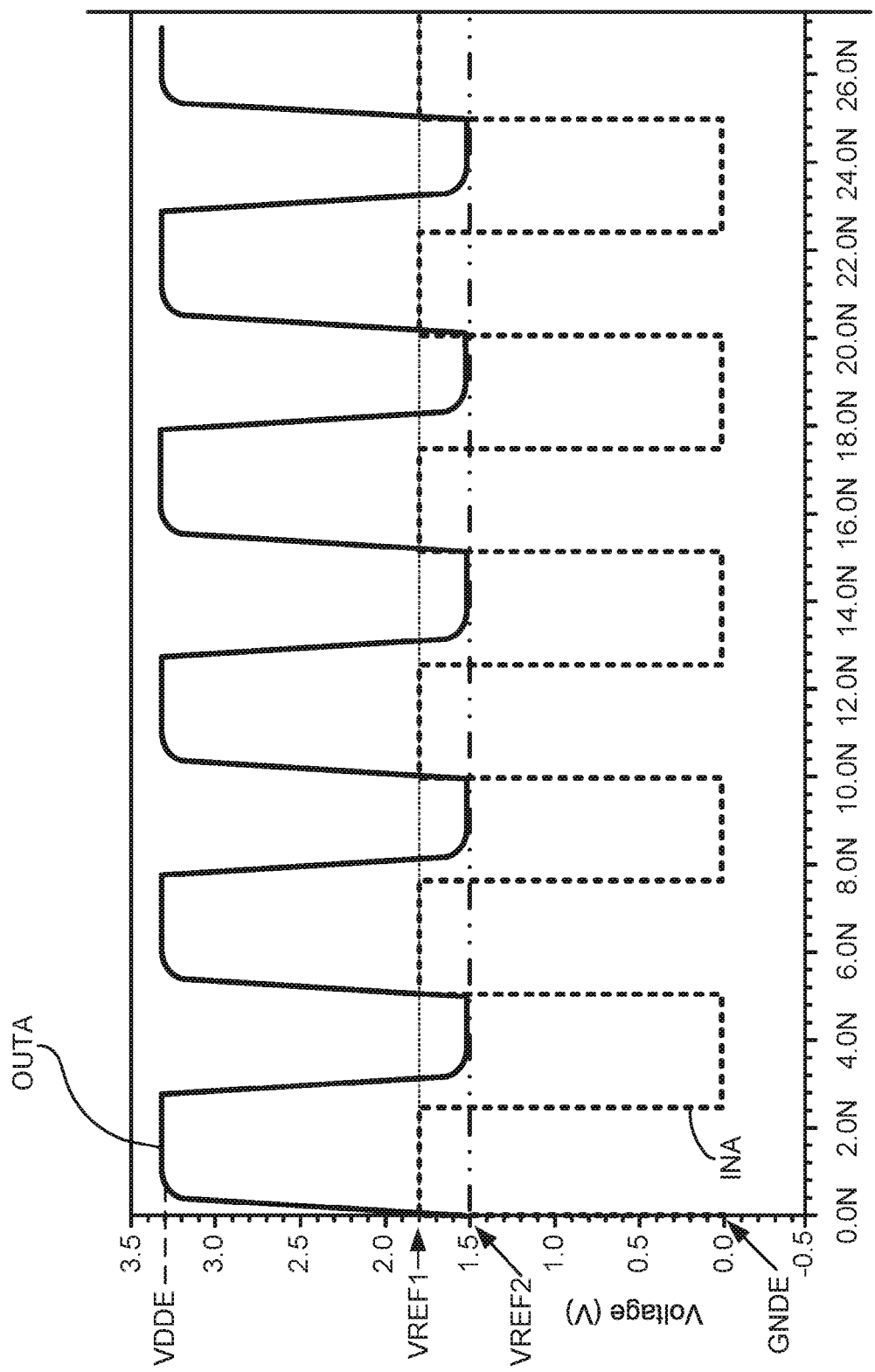
FIG. 7 is a graph illustrating signals of the voltage range up level shifter of FIG. 3 during operation of the level shifter according to a further embodiment of the present disclosure.

FIG. 7 is a graph illustrating signals of the up level shifter circuit 300 of FIG. 3 during operation of the level shifter according to another embodiment of the present disclosure. The graph once again shows time along the horizontal axis and voltage along the vertical axis. In this embodiment, the up level shifter circuit 300 is performing an up level shift of the input signals INA, INB and the first internal reference voltage VREF1 equals 1.815V, the supply voltage VDDE equals 3.3V, the second reference voltage VREF2 equals 1.485V, and the supply reference voltage GNDE equals 0V. Thus, in this embodiment the first voltage domain of the INA, INB signals (GNDE-VREF1) is equal to the voltage range (0V-1.815V) while the second voltage domain for the OUTA, OUTB signals is equal to the voltage range (1.485V-3.3V). Only the INA and OUTA signals are shown in FIG. 7. As seen in the graph of FIG. 7, the OUTA signal is slightly delayed relative to but once again tracks the INA signal. In the example of FIG. 7, $\alpha$=0.55 and $\beta$=0.45.

Figure 8:
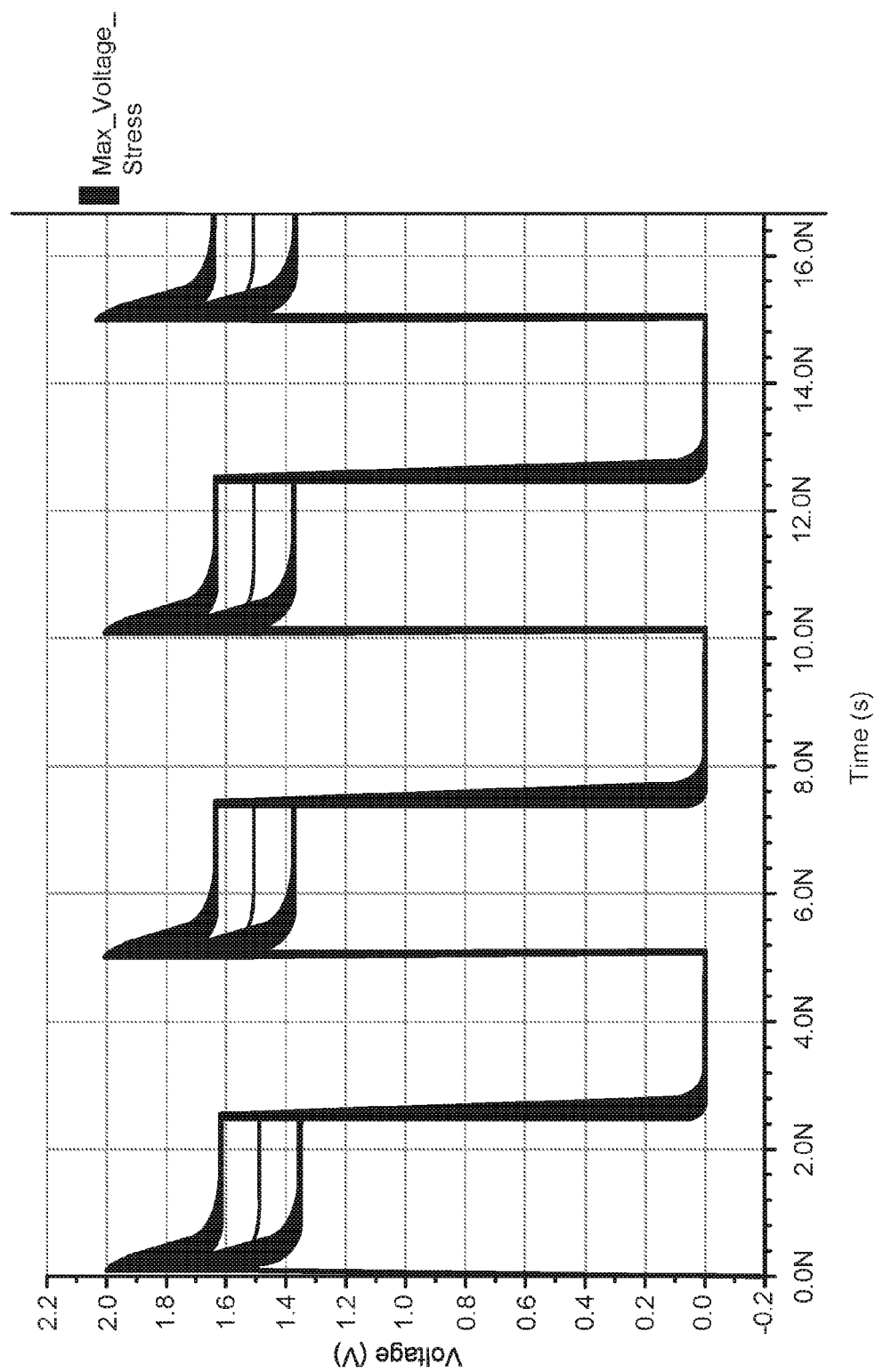
FIG. 8 is a graph illustrating the maximum voltage stress across devices in the voltage range up level shifter of FIG. 3 for sixteen possible process, voltage, and temperature (PVT) corners according to further embodiments of the present disclosure.

FIG. 8 is a graph illustrating the maximum voltage stress across MOS devices in the up level shifter circuit 300 of FIG. 3 for sixteen possible process, voltage, and temperature (PVT) corners according to further embodiments of the present disclosure. As will be understood by those skilled in the art, a "process corner" is an example of a technique that refers to a variation of fabrication parameters used in applying an integrated circuit design to a semiconductor wafer. Process corners correspond to the extremes of these parameter variations that are permissible such that the circuitry being formed in the integrated circuit, in this case the level shifter circuits 300, 400, will function correctly and the MOS devices forming these circuits will not be overstressed (i.e., experience voltages across any of the junctions of these devices that exceed the maximum permissible voltage stress. FIG. 8 thus illustrates the maximum voltage stress across the MOS devices for sixteen different PVT combinations of process (slow, fast, Nslow, Pfast, Nfast, Pslow), voltage (minimum, maximum), and temperature (minimum, maximum). This yields sixteen different PVT corners. In current advanced technology integrated circuits formed including devices having dimensions below 40 nm, the maximum voltage stress tolerance of oxides in these devices, such as the gate oxide in a MOS device, is less than 2 volts. As seen in FIG. 8, the maximum permissible voltage across the MOS devices in the circuit 300 is 2.2 volts and the graphs shows that the actual experienced voltage stress has a maximum of approximately 2 volts, which is less than the maximum permissible value. This means the MOS devices in the circuit 300 are adequately protected.

FIG. 9 is a functional block diagram of an electronic system 900 including one or both the levels shifters 300, 400 of FIGS. 3 and 4 according to another embodiment of the present disclosure. The electronic system 900 includes electronic circuitry 902 for performing desired functions, such as executing specific software or operating to perform a specific function. The integrated circuit 100 of FIG. 1 is shown as being contained in the electronic circuitry 902, and this circuitry may include additional integrated circuits as represented by the integrated circuit 903 in FIG. 9. Some of all of the integrated circuits 100, 903 in the electronic circuitry 902 may include the level shifter circuits 300, 400.

The electronic system 900 may be a computer system, such as a personal, laptop, or table computer, or could be a device such as a smart phone. The system 900 further includes one or more input devices 904, such as a keyboard, mouse, keypad, touch screen, and so on, which is coupled to the electronic circuitry 402. Typically, the system 900 also includes one or more output devices 906 coupled to the electronic circuitry 902, such output devices being a video display, audio output such as a speaker, a printer, and so one depending on the specific function of the system 900. One or more data storage devices 908 may also be coupled to the electronic circuitry 902 to store data or retrieve data from external storage media (not shown). Examples of typical storage devices 908 include solid state drives (SSDs), FLASH memories, hard and floppy disks, tape cassettes, compact disk read-only (CD-ROMs) and compact disk read-write (CD-RW) memories, and digital video disks (DVDs), magnetic tape, and so on.

One skilled in the art will understood that even though various embodiments and advantages of the present disclosure have been set forth in the foregoing description, the above disclosure is illustrative only, and changes may be made in detail, and yet remain within the broad principles of the present disclosure. For example, some or all of the components described above may in other embodiments be implemented using different technologies, such as bipolar junction, gallium arsenide, thin film, or organic field effect transistors, or a combination of these technologies and the MOS technology of the above-described embodiments. Therefore, the subject matter covered by the present disclosure is to be limited only by the following claims or other claims subsequently submitted but based on the present disclosure.

What is claimed is:

1. A level shifter circuit configured to receive first and second complementary input signals, each of the first and second complementary input signals having a value of either a first supply voltage or a first reference voltage and the level shifter further including a strong latch circuit operable in response to the first and second complementary input signals to drive one of first and second complementary output signals to a second supply voltage and including a weak latch circuit operable to drive the other of the first and second complementary output signals to a second reference voltage;
> wherein the strong latch circuit is coupled between a first supply voltage node and first and second complementary output nodes on which the first and second output signals are provided, respectively;
> wherein the weak latch circuit is coupled between a first reference voltage node and the first and second complementary output nodes; and
> wherein the level shifter circuit further includes:
>> a first input signal write circuit coupled between the first complementary output node and a second supply voltage node, the first input signal write circuit configured to receive the first complementary input signal on a first complementary input node and operable in response to the first complementary input signal to cause the strong latch circuit to drive the second output signal on the second complementary output node to approximately a supply voltage on the first supply voltage node, and the weak latch circuit operable responsive to the second output signal to drive the first output signal on the first complementary output node to approximately a reference voltage on the first reference node; and
>> a second input signal write circuit coupled between the second complementary output node and the second supply voltage node, the second input signal write circuit configured to receive the second complementary input signal on a second complementary input node and operable in response to the second complementary input signal to cause the strong latch circuit to drive the first output signal on the first complementary output node to approximately the supply voltage on the first supply voltage node, and the weak latch circuit operable responsive to the first output signal to drive the second output signal on the second complementary output node to approximately the reference voltage on the first reference node.

2. The level shifter circuit of claim 1, wherein the strong latch comprises MOS transistors having a first conductivity type and the weak latch comprises MOS transistors having a second conductivity type, the size of the MOS transistors in the strong latch being larger than the size of the MOS transistors in the weak latch.

3. The level shifter circuit of claim 2, wherein the strong latch circuit comprises:
> a first MOS transistor having a first signal node coupled to the first supply voltage node, a second signal node coupled to the first complementary output node, and a control node coupled to the second complementary output node; and
> a second MOS transistor having a first signal node coupled to the first supply voltage node, a second signal node coupled to the second complementary output node, and a control node coupled to the first complementary output node.

4. The level shifter circuit of claim 3, wherein the weak latch circuit comprises:
> a third MOS transistor having a first signal node coupled to the first reference voltage node, a second signal node coupled to the first complementary output node, and a control node coupled to the second complementary output node; and
> a fourth MOS transistor having a first signal node coupled to the first reference voltage node, a second signal node coupled to the second complementary output node, and a control node coupled to the first complementary output node.

5. The level shifter circuit of claim 4, wherein each of the first and second input signal write circuits comprises:
> a fifth MOS transistor having a first signal node coupled to the second supply voltage node, a second signal node coupled to a first intermediate node, and a control node coupled to the first complementary input node;
> a sixth MOS transistor having a first signal node coupled to the first intermediate node, a second signal terminal coupled to a second intermediate node, and a control node coupled to a second reference voltage node;
> a seventh MOS transistor having a first signal node coupled to the second intermediate node, a second signal node coupled to the corresponding first or second complementary output node, and a control node coupled to the first reference voltage node;
> an eighth MOS transistor having a first signal node coupled to the first intermediate node, a second signal node coupled to the second reference voltage node, and a control node coupled to the corresponding first or second complementary input node;
> a ninth MOS transistor having a first signal node coupled to the first reference voltage node, a second signal node coupled to the corresponding first or second complementary output node, and a control node coupled to the second intermediate node; and
> a capacitor having a first signal node coupled to the corresponding first or second complementary output node and a second signal node coupled to the second intermediate node.

6. The level shifter circuit of claim 5,
wherein the first conductivity type is P-type and the second conductivity type is N-type;
wherein the fifth and sixth MOS transistors are N-type transistors;
wherein the seventh, eighth and ninth transistors are P-type transistors;
wherein the first supply voltage node receives a positive supply voltage VDDE;
wherein the second supply voltage node receives a ground voltage GNDE;
wherein the first reference voltage node receives a second reference voltage VREF2; and
wherein the second reference voltage node receives a first reference voltage VREF1, the magnitude of the first reference voltage VREF1 being greater than or equal to the magnitude of second reference voltage VREF2.

7. The level shifter circuit of claim 5,
wherein the first conductivity type is N-type and the second conductivity type is P-type,
wherein the fifth and sixth MOS transistors are P-type transistors;
wherein the seventh, eighth and ninth transistors are N-type transistors;
wherein the first supply voltage node receives a ground voltage GNDE;
wherein the second supply voltage node receives a positive supply voltage VDDE;
wherein the first reference voltage node receives a first reference voltage VREF1; and
wherein the second reference voltage node receives a second reference voltage VREF2, the magnitude of the first reference voltage VREF1 being greater than or equal to the magnitude of second reference voltage VREF2.

8. An electronic system, comprising:
  a data input device;
  a data output device;
  a data storage device; and
  electronic circuitry coupled to the data input device, data output device, and data storage device, the electronic circuitry comprising at least one integrated circuit including a plurality of input/output buffer circuits, each of the plurality of buffer circuits including at least one level shifter circuit configured to receive first and second complementary input signals, each of the first and second complementary input signals having a value of either a first supply voltage or a first reference voltage and the level shifter further including a strong latch circuit operable in response to the first and second complementary input signals to drive one of first and second complementary output signals to a second supply voltage and including a weak latch circuit operable to drive the other of the first and second complementary output signals to a second reference voltage;
  wherein the strong latch circuit is coupled between a first supply voltage node and first and second complementary output nodes on which the first and second output signals are provided, respectively,
  wherein the weak latch circuit is coupled between a first reference voltage node and the first and second complementary output nodes; and
  wherein the level shifter circuit further includes;
    a first input signal write circuit coupled between the first complementary output node and a second supply voltage node, the first input signal write circuit configured to receive the first complementary input signal on a first complementary input node and operable in response to the first complementary input signal to cause the strong latch circuit to drive the second output signal on the second complementary output node to approximately a supply voltage on the first supply voltage node, and the weak latch circuit operable responsive to the second output signal to drive the first output signal on the first complementary output node to approximately a reference voltage on the first reference node; and
    a second input signal write circuit coupled between the second complementary output node and the second supply voltage node, the second input signal write circuit configured to receive the second complementary input signal on a second complementary input node and operable in response to the second complementary input signal to cause the strong latch circuit to drive the first output signal on the first complementary output node to approximately the supply voltage on the first supply voltage node, and the weak latch circuit operable responsive to the first output signal to drive the second output signal on the second complementary output node to approximately the reference voltage on the first reference node.

9. The electronic system of claim 8, wherein the electronic circuitry comprises multiple integrated circuits and the input/output buffer circuits are configured to communicate signals between integrated circuits through the level shifter circuits.

10. The electronic system of claim 9, wherein the multiple integrated circuits utilize different supply voltages.

11. The electronic system of claim 9, wherein the first supply voltage is a positive supply voltage, the second supply voltage is a second positive supply voltage that is greater than the first positive supply voltage, the first reference voltage is a first positive reference voltage and the second reference voltage is a second positive reference voltage that is less than the first positive reference voltage.

12. The electronic system of claim 11, wherein the second supply voltage has a value of one of 1.8V, 2.5V, and 3.3V or any other voltage between 1.8V and 3.3V.

13. The electronic system of claim 9, wherein the strong latch comprises MOS transistors having a first conductivity type and the weak latch comprises MOS transistors having a second conductivity type, the size of the MOS transistors in the strong latch being larger than the size of the MOS transistors in the weak latch.

14. The electronic system of claim 13, wherein the strong latch circuit comprises:
  a first MOS transistor having a first signal node coupled to the first supply voltage node, a second signal node coupled to the first complementary output node, and a control node coupled to the second complementary output node; and
  a second MOS transistor having a first signal node coupled to the first supply voltage node, a second signal node coupled to the second complementary output node, and a control node coupled to the first complementary output node.

15. The electronic system of claim 14, wherein the weak latch circuit comprises:
  a third MOS transistor having a first signal node coupled to the first reference voltage node, a second signal node coupled to the first complementary output node, and a control node coupled to the second complementary output node; and
  a fourth MOS transistor having a first signal node coupled to the first reference voltage node, a second signal node coupled to the second complementary output node, and a control node coupled to the first complementary output node.

16. The electronic system of claim 15, wherein each of the first and second input signal write circuits comprises:
  a fifth MOS transistor having a first signal node coupled to the second supply voltage node, a second signal node coupled to a first intermediate node, and a control node coupled to the first complementary input node;
  a sixth MOS transistor having a first signal node coupled to the first intermediate node, a second signal terminal coupled to a second intermediate node, and a control node coupled to a second reference voltage node;
  a seventh MOS transistor having a first signal node coupled to the second intermediate node, a second signal node coupled to the corresponding first or second complementary output node, and a control node coupled to the first reference voltage node;
  an eighth MOS transistor having a first signal node coupled to the first intermediate node, a second signal node coupled to the second reference voltage node, and a control node coupled to the corresponding first or second complementary input node;
  a ninth MOS transistor having a first signal node coupled to the first reference voltage node, a second signal node coupled to the corresponding first or second complementary output node, and a control node coupled to the second intermediate node; and
  a capacitor having a first signal node coupled to the corresponding first or second complementary output node and a second signal node coupled to the second intermediate node.

17. The electronic system of claim 16,
wherein the first conductivity type is P-type and the second conductivity type is N-type;
wherein the fifth and sixth MOS transistors are N-type transistors;
wherein the seventh, eighth and ninth transistors are P-type transistors;
wherein the first supply voltage node receives a positive supply voltage VDDE;
wherein the second supply voltage node receives a ground voltage GNDE;
wherein the first reference voltage node receives a second reference voltage VREF2; and
wherein the second reference voltage node receives a first reference voltage VREF1, the magnitude of the first reference voltage VREF1 being greater than or equal to the magnitude of second reference voltage VREF2.

18. The electronic system of claim 16,
wherein the first conductivity type is N-type and the second conductivity type is P-type,
wherein the fifth and sixth MOS transistors are P-type transistors;
wherein the seventh, eighth and ninth transistors are N-type transistors;
wherein the first supply voltage node receives a ground voltage GNDE;
wherein the second supply voltage node receives a positive supply voltage VDDE;
wherein the first reference voltage node receives a first reference voltage VREF1; and
wherein the second reference voltage node receives a second reference voltage VREF2, the magnitude of the first reference voltage VREF1 being greater than or equal to the magnitude of second reference voltage VREF2.

* * * * *